(12) United States Patent
Ohnishi

(10) Patent No.: US 8,038,793 B2
(45) Date of Patent: Oct. 18, 2011

(54) EPITAXIAL GROWTH METHOD

(75) Inventor: Masato Ohnishi, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 6 days.

(21) Appl. No.: 12/743,976

(22) PCT Filed: Nov. 18, 2008

(86) PCT No.: PCT/JP2008/003359
§ 371 (c)(1),
(2), (4) Date: May 20, 2010

(87) PCT Pub. No.: WO2009/078124
PCT Pub. Date: Jun. 25, 2009

(65) Prior Publication Data
US 2010/0251958 A1    Oct. 7, 2010

(30) Foreign Application Priority Data
Dec. 14, 2007  (JP) ................................ 2007-322814

(51) Int. Cl.
*C30B 21/02*    (2006.01)
(52) U.S. Cl. ............. 117/84; 117/86; 117/90; 117/95; 118/715 R
(58) Field of Classification Search ........... 117/84, 117/86, 90, 94, 95; 118/715 R
See application file for complete search history.

(56) References Cited

U.S. PATENT DOCUMENTS
4,322,592 A * 3/1982 Martin ..................... 219/634
6,099,648 A   8/2000 Anderson FOREIGN PATENT DOCUMENTS
JP    1-239086    *  9/1989
JP    A-2001-044125    2/2001
JP    A-2001-512901    8/2001

OTHER PUBLICATIONS

International Search Report issued in International Application No. PCT/JP2008/003359 on Dec. 16, 2008 (with English-language translation).

* cited by examiner

*Primary Examiner* — Bob M Kunemund
(74) *Attorney, Agent, or Firm* — Oliff & Berridge, PLC

(57) ABSTRACT

The invention provides an epitaxial growth method which is a single wafer processing epitaxial growth method by which at least a single crystal substrate is placed in a reaction chamber with an upper wall having a downward convexity and an epitaxial layer is deposited on the single crystal substrate by introducing raw material gas and carrier gas into the reaction chamber through a gas feed port, in which, after any one of the radius of curvature of the upper wall of the reaction chamber and a difference between an upper end of the gas feed port and a lower end of the upper wall of the reaction chamber in the height direction or both are adjusted in accordance with the flow rate of the carrier gas which is introduced into the reaction chamber through the gas feed port, an epitaxial layer is deposited on the single crystal substrate. As a result, a single wafer processing epitaxial growth method is provided that can obtain the effects, such as an increase in the quality of an epitaxial wafer and an increase in productivity, which are produced by the degree of the flow rate of carrier gas, and deposit an epitaxial layer on a single crystal substrate without deforming the film thickness shape.

24 Claims, 9 Drawing Sheets

(A)

POSITION IN WHICH REACTION STARTS IS NEAR CENTER OF SUBSTRATE

PERIPHERAL SAG (B)

POSITION IN WHICH REACTION STARTS IS NEAR PERIPHERY OF SUBSTRATE

| H(mm) | Uniformity % | | |
|---|---|---|---|
| | R=3556(mm) | R=4500(mm) | R=5500(mm) |
| 1 | 2.7 | 0.85 | 1.16 |
| 1.5 | 2.3 | 0.4 | 1.37 |
| 3 | 1.9 | 1.12 | 1.75 |
| 4.5 | 2.1 | 1.95 | 2.03 |

| H(mm) | Uniformity % | | |
|---|---|---|---|
| | R=2000(mm) | R=3556(mm) | R=5500(mm) |
| 1.5 | 1.94 | 1.8 | 2 |
| 3 | 1.67 | 1.1 | 1.8 |
| 4.5 | 1.42 | 0.51 | 2.1 |
| 6 | 1.22 | 1.6 | 2.4 |

POSITION FROM CENTER OF SUBSTRATE (mm)

POSITION FROM CENTER OF SUBSTRATE (mm)

EPITAXIAL GROWTH METHOD

TECHNICAL FIELD

The present invention relates to a single wafer processing epitaxial growth method by which an epitaxial layer is deposited on a single crystal substrate.

BACKGROUND ART

An epitaxial growth technique is a technique of obtaining a single crystal thin film layer by vapor deposition, the single crystal thin film layer used in production of an integrated circuit such as a MOSLSI or a bipolar transistor, and is a highly important technique because the technique makes it possible to grow a uniform single crystal thin film on a clean semiconductor single crystal substrate according to a crystal orientation of the substrate and form a steep impurity gradient at a junction where there is a great difference in dopant concentration.

As a typical apparatus for performing such epitaxial growth, there are three types of apparatuses: a vertical (pancake) type, a barrel (cylinder) type, and a horizontal type. These growth apparatuses have common basic principles. The growth apparatus includes a reaction chamber inside which a susceptor is provided, the susceptor on which a single crystal substrate is mounted, a heating unit provided outside the reaction chamber and made up of a halogen lamp or the like, and other components. Of the vertical types, a apparatus processing substrates one at a time is called a single wafer processing epitaxial growth apparatus.

Here, the single wafer processing epitaxial growth apparatus will be explained with reference to FIG. 8. FIG. 8 is a schematic diagram showing an example of a conventionally-used, common single wafer processing epitaxial growth apparatus.

A single wafer processing epitaxial growth apparatus 101 has a reaction chamber 103 inside which a single crystal substrate 102 is placed, the single crystal substrate 102 with a front surface on which an epitaxial deposited is deposited, and is provided with a gas feed port 104 for introducing raw material gas/carrier gas into the reaction chamber 103 and a gas exhaust port 105 for exhausting the gas therefrom. Moreover, inside the reaction chamber 103, a susceptor 106 on which the single crystal substrate 102 is mounted is provided. Incidentally, an upper wall 107 of the reaction chamber 103 is made of silica glass.

Also, at least, in the outside of the reaction chamber 103, a heating unit 108, such as a halogen lamp, which heats the single crystal substrate 102 is provided.

When an epitaxial layer is formed on the single crystal substrate 102 by using this single wafer processing epitaxial growth apparatus 101, the single crystal substrate 102 is placed on a pocket formed in the susceptor 106, and the single crystal substrate 102 is heated to a predetermined temperature by the heating unit 108 while rotating the single crystal substrate 102 by a support shaft 109 supporting the susceptor 106 and an unillustrated rotation mechanism rotating the support shaft 109 (making the support shaft 109 rotate). Then, when a silicon single crystal layer, for example, is epitaxially grown, the growth is performed by feeding raw material gas, such as trichlorosilane, which is diluted with carrier gas such as hydrogen into the reaction chamber 103 through the gas feed port 104 at a predetermined flow rate for a predetermined time.

However, when epitaxial growth is performed by using such an epitaxial growth apparatus 101, the film thickness of an epitaxial layer deposited on a single crystal becomes non-uniform, leading to a problem with a film thickness shape.

The reason is considered to be as follows. The raw material gas introduced into the reaction chamber 103 through the gas feed port 104 is gradually consumed for the formation of the epitaxial layer when passing over the single crystal substrate 102, resulting in decreased concentration of the raw material gas in a direction from the gas feed port 104 toward the gas exhaust port 105.

On the other hand, Japanese Translation of PCT International Application Publication No. 2001-512901 discloses a method for performing epitaxial growth by using an epitaxial growth apparatus 101' in which an upper wall 107' of a reaction chamber is not flat but has a downward convexity, unlike the epitaxial growth apparatus 101 of FIG. 8. In FIG. 9, an example of this single wafer processing epitaxial growth apparatus 101' is shown.

There has been an attempt to make the film thickness of an epitaxial layer uniform by, as in the epitaxial growth apparatus 101' described above, promoting an epitaxial reaction effectively by narrowing the space in the center of the reaction chamber by placing a single crystal substrate inside the reaction chamber whose upper wall 107' has a downward convexity and performing epitaxial growth.

However, even when such an epitaxial growth apparatus 101' is used, an excellent film thickness shape (film thickness distribution) may not be obtained, and this growth apparatus is inadequate.

Incidentally, the flow rate of carrier gas has the greatest influence on the film thickness distribution, and it is necessary to set an optimum carrier gas flow rate for each growth apparatus.

Furthermore, as described above, it is known that the film thickness shape is also influenced by the upper wall of the reaction chamber. In addition, there is a considerable individual difference among the upper walls of the reaction chambers, and the upper walls have various shapes microscopically. Therefore, even when apparatuses of the same model are used, due to the individual difference among the upper walls of the reaction chambers, the growth apparatuses have different optimum carrier gas flow rates for the film thickness shape.

Moreover, as for the relationship between the quality etc. of the epitaxial wafer other than the film thickness shape and the flow rate of carrier gas, when priority is given to the quality of, for example, a back surface halo or back surface nanotopology, it is necessary to increase the flow rate of the carrier gas (for example, hydrogen) which is introduced into the reaction chamber. This makes the film thickness of the epitaxial layer near the outer edge of the single crystal substrate particularly small (results in the generation of the peripheral sag), lowering the degree of flatness. On the other hand, in order to increase productivity, it is necessary to decrease the carrier gas flow rate and thereby reduce by-products that would accumulate in the reaction chamber. However, in this case, it is known that the film thickness shape has a thick peripheral part, also lowering the degree of flatness.

The above-described high or low quality of the epitaxial wafer other than the film thickness shape and productivity do not necessarily match the high or low quality of the film thickness shape of the epitaxial layer, and it is difficult to strike a balance between them in an optimum state.

DISCLOSURE OF INVENTION

The present invention has been made in view of the problems described above, and an object thereof is to provide a single wafer processing epitaxial growth method that can obtain the effects, such as an increase in the quality of an epitaxial wafer and an increase in productivity, which are produced by the degree of the flow rate of carrier gas, and deposit an epitaxial layer on a single crystal substrate without deforming the film thickness shape.

To solve the above problems, the present invention provides an epitaxial growth method which is a single wafer processing epitaxial growth method by which at least a single crystal substrate is placed in a reaction chamber with an upper wall having a downward convexity and an epitaxial layer is deposited on the single crystal substrate by introducing raw material gas and carrier gas into the reaction chamber through a gas feed port, wherein, after any one of the radius of curvature of the upper wall of the reaction chamber and a difference between an upper end of the gas feed port and a lower end of the upper wall of the reaction chamber in a height direction or both are adjusted in accordance with a flow rate of the carrier gas which is introduced into the reaction chamber through the gas feed port, an epitaxial layer is deposited on the single crystal substrate.

Through an intensive study in search of the method for obtaining both an increase in the quality of an epitaxial wafer other than the film thickness shape and an increase in productivity and an improved film thickness distribution of an epitaxial layer, the inventor has focused attention on the upper wall of the reaction chamber and found out that making an adjustment to the upper wall of the reaction chamber in accordance with the flow rate of the carrier gas is effective. Specifically, the inventor has found out that, as in the present invention, making an adjustment to the radius of curvature of the upper wall of the reaction chamber and a difference between the upper end of the gas feed port and the lower end of the upper wall of the reaction chamber in the height direction is important.

In the conventional method in which priority is given to productivity, the sag in the outermost region becomes worse. By contrast, when an epitaxial layer is deposited on the single crystal substrate after making an adjustment to any one of the radius of curvature of the upper wall of the reaction chamber and a difference between the upper end of the gas feed port and the lower end of the upper wall of the reaction chamber in the height direction or both in accordance with the flow rate of the carrier gas which is introduced into the reaction chamber through the gas feed port in the manner as described above, it is possible to obtain the effect, such as productivity or the quality of the back surface, which is produced by the carrier gas at each flow rate, and deposit an excellent epitaxial layer having a uniform film thickness distribution.

In this case, it is preferable that, when the epitaxial layer is deposited on the single crystal substrate, the single crystal substrate is placed on a susceptor having one or more through holes formed therein.

By doing so, it is possible to remove a native oxide film on the back surface of the single crystal substrate and prevent the formation of halo effectively.

Moreover, at this time, the single crystal substrate may have a diameter of 300 mm or more.

When the single crystal substrate has a relatively large diameter of 300 mm or more, a film thickness distribution of the epitaxial layer is more likely to become particularly non-uniform, and therefore the epitaxial growth method of the present invention is especially effective.

Furthermore, as the raw material gas, trichlorosilane may be used, and, as the carrier gas, hydrogen may be used.

As described above, by using trichlorosilane as the raw material gas and hydrogen as the carrier gas, is possible to deposit a high-quality silicon single crystal layer on the single crystal substrate.

In addition, when the flow rate of the carrier gas which is introduced into the reaction chamber through the gas feed port is set at more than 70 slm, any one of adjustments or both may be made such that the radius of curvature of the upper wall of the reaction chamber becomes 4500 mm or more but less than 7500 mm and a difference between the upper end of the gas feed port and the lower end of the upper wall of the reaction chamber in the height direction becomes 0 mm or more but 2 mm or less.

By doing so, even when the single crystal substrate is placed on, for example, a susceptor having one or more through holes formed therein at the time of epitaxial growth, it is possible to prevent deterioration of nanotopology of the back surface of the single crystal substrate more effectively, obtain an epitaxial wafer with a back surface of higher quality, and obtain a high-quality epitaxial wafer with an epitaxial layer having an uniform film thickness distribution.

Moreover, when the flow rate of the carrier gas which is introduced into the reaction chamber through the gas feed port is set at less than 60 slm, any one of adjustments or both may be made such that the radius of curvature of the upper wall of the reaction chamber becomes more than 3000 mm but less than 4500 mm and a difference between the upper end of the gas feed port and the lower end of the upper wall of the reaction chamber in the height direction becomes 2.5 mm or more.

By doing so, by-products of reaction are less likely to adhere to the inside of the reaction chamber, making it possible to decrease frequency of cleaning of the inside of the reaction chamber, and it is possible to obtain a high-quality epitaxial wafer with an epitaxial film having an uniform film thickness distribution.

With the epitaxial growth method of the present invention, it is possible to obtain the effects, such as an increase in the quality of the back surface of an epitaxial wafer and an increase in productivity, which are produced in accordance with the flow rate of the carrier gas, and deposit an epitaxial layer with a high degree of film thickness uniformity on the single crystal substrate and thereby obtain a high-quality epitaxial wafer.

BEST MODE FOR CARRYING OUT THE INVENTION

Hereinafter, an embodiment of the present invention will be described; however, the present invention is not limited thereto.

Figure 9:
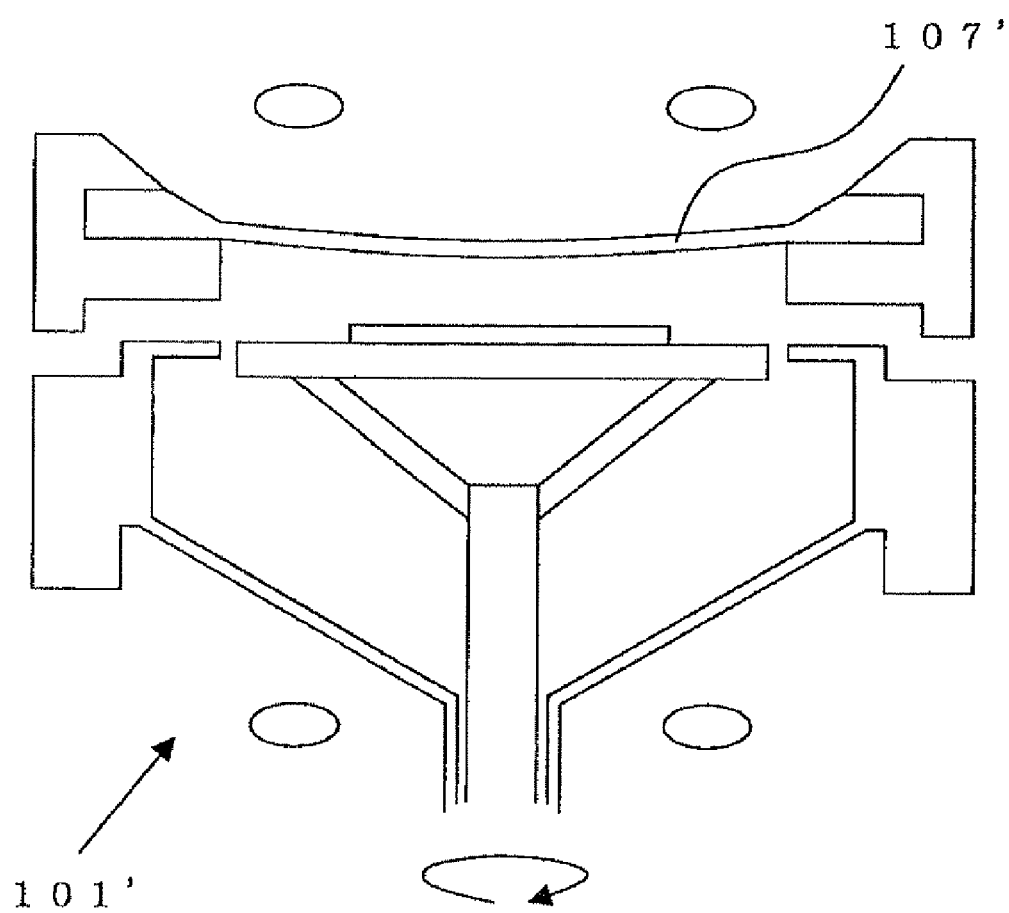
FIG. 9 It is a schematic diagram showing another example of a conventional single wafer processing epitaxial growth apparatus.

First, the inventor conducted a study of the film thickness distribution of an epitaxial layer deposited on a single crystal substrate by a conventional epitaxial growth method by using a single wafer processing epitaxial growth apparatus in which an upper wall of a reaction chamber had a downward convexity as shown in FIG. 9. Incidentally, here, trichlorosilane was used as raw material gas, hydrogen was used as carrier gas, and a silicon single crystal layer was deposited on a silicon single crystal substrate.

Figure 2:
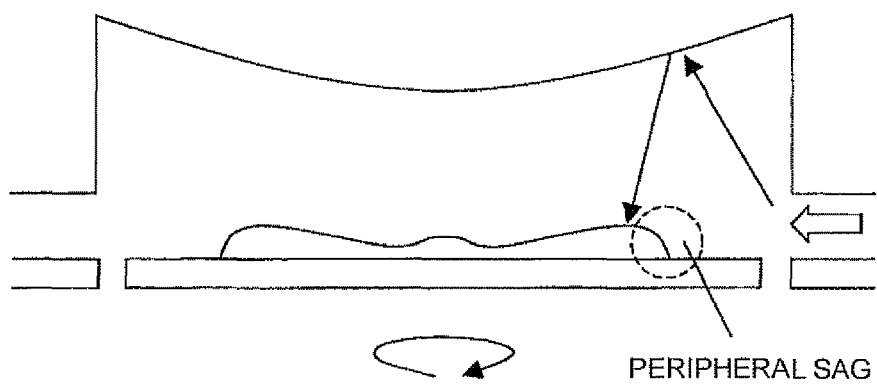
FIG. 2 (A) is an explanatory diagram showing an example of how an epitaxial layer is deposited when epitaxial growth is performed by a conventional method; and (B) is an explanatory diagram showing an example of how an epitaxial layer is deposited when epitaxial growth is performed after an adjustment is made to an upper wall of a reaction chamber.
Figure 2:
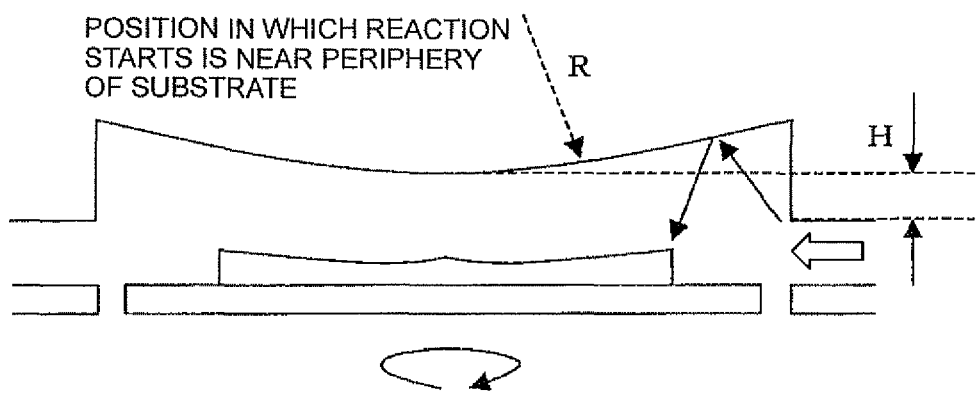

The results of the study revealed that the vertical section of the silicon single crystal layer had a shape shown in FIG. 2(A), and the film thickness distribution was nonuniform. That is, as was obvious from the shape of the vertical section, the silicon single crystal layer had a relatively thick layer in the center and outer region of the silicon single crystal substrate, and had a thin layer between the center and the outer region and in the outermost region of the silicon single crystal substrate. In particular, inadequate deposition in the outermost region resulted in the generation of a large peripheral sag.

The inventor thought that the cause of the inadequate epitaxial growth in the outermost region in particular of the single crystal substrate and the generation of the peripheral sag was as follows. Because of the improper size of the reaction chamber and the improper shape of the upper wall, a position in which the epitaxial growth began as a result of a reaction between trichlorosilane and hydrogen was rather near the center than the outermost region of the single crystal substrate, making it hard to deposit the epitaxial layer on the outermost region adequately.

In addition, the inventor found out that it was possible to deposit the epitaxial layer adequately near the outermost region of the single crystal substrate and suppress the generation of the peripheral sag greatly by bringing a position in which reaction of trichlorosilane, which was raw material gas, started closer to the periphery of the single crystal substrate, for example, by adjusting the shape of the upper wall of the reaction chamber and the size of the reaction chamber, that is, the radius of curvature (R) of the upper wall of the reaction chamber and a difference (H) between the upper end of the gas feed port and the lower end of the upper wall of the reaction chamber in the height direction.

In FIG. 2(B), an example of how an epitaxial layer is deposited when epitaxial growth is performed after an adjustment is made to the upper wall of the reaction chamber as in the present invention is shown. In this way, the inventor found out that a shape in which the epitaxial layer was deposited adequately in the outermost region was obtained and the film thickness distribution could be improved without suffering from the large peripheral sag as in the conventional method by adjusting the radius of curvature (R) of the upper wall of the reaction chamber and a difference (H) between the upper end of the gas feed port and the lower end of the upper wall of the reaction chamber in the height direction, and completed the present invention.

Hereinafter, the present invention will be described in more detail.

Figure 1:
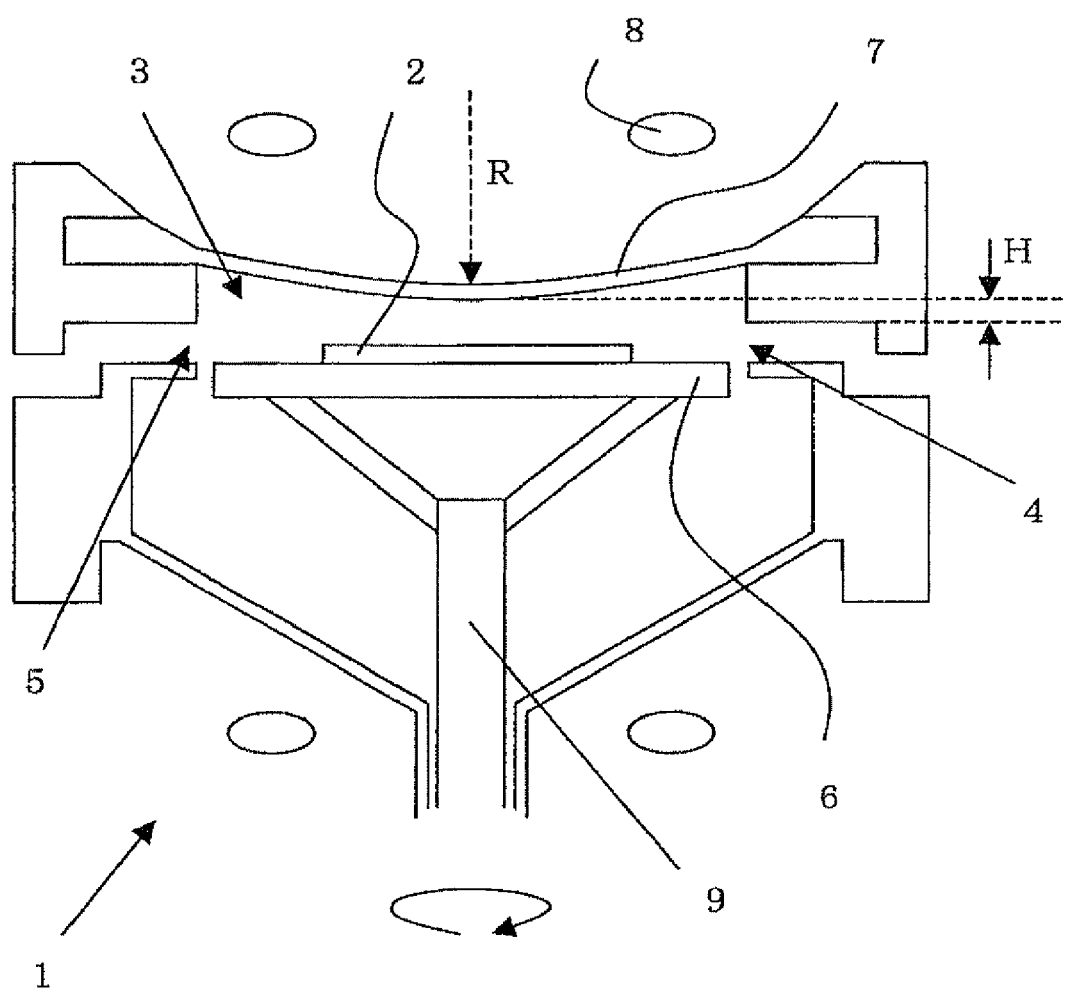
FIG. 1 It is a schematic diagram showing an example of a single wafer processing epitaxial growth apparatus that can be used when an epitaxial growth method of the present invention is performed.

First, an example of a single wafer processing epitaxial growth apparatus that can be used when an epitaxial growth method of the present invention is performed is shown in FIG. 1, and an outline of the epitaxial growth apparatus will be described.

A single wafer processing epitaxial growth apparatus 1 of FIG. 1 has a reaction chamber 3. Inside the reaction chamber 3, a single crystal substrate 2 is placed on a susceptor 6. Moreover, a gas feed port 4 for introducing raw material gas and carrier gas for epitaxial growth into the reaction chamber 3 and a gas exhaust port 5 through which these gases are exhausted from the reaction chamber 3 are provided.

In addition, outside the reaction chamber 3, a heating unit 8 is provided, making it possible to heat the single crystal substrate 2 and the inside of the reaction chamber 3 when epitaxial growth is performed. The heating unit 8 is not particularly limited, and a halogen lamp, for example, can be used.

In the member forming the reaction chamber 3, an upper wall 7 is made of silica glass and has a downward convexity. In addition, as will be described later, the upper wall 7 having a downward convexity is disposed so as to have a proper radius of curvature appropriate to the flow rate of carrier gas which is introduced through the gas feed port 4 at the time of epitaxial growth and have a lower end of the upper wall 7 positioned at a proper level with respect to an upper end of the gas feed port 4, so that the film thickness distribution of an epitaxial layer to be deposited becomes uniform.

Moreover, although other parts of the member forming the reaction chamber 3 are mainly made of silica glass, the material, shape, and the like, of the other parts are not particularly limited. For example, the same material, shape, and the like, as those of a common epitaxial growth apparatus can be used.

Furthermore, the susceptor 6 is attached to a support shaft 9. The support shaft 9 is provided with a mechanism (not shown) for rotating the support shaft 9 (making the support shaft 9 rotate), and is rotatable. That is, by rotating the support shaft 9, it is possible to rotate the susceptor 6 and the single crystal substrate 2 placed thereon.

Hereinafter, an epitaxial growth method of the present invention, the method using the single wafer processing epitaxial growth apparatus 1 described above, will be described.

Here, as an example, a case in which a silicon single crystal layer is deposited by using a silicon single crystal substrate as a single crystal substrate on which the epitaxial layer is deposited and using trichlorosilane and hydrogen as raw material gas and carrier gas, respectively, will be described. These are often used in most cases, and can produce a useful epitaxial silicon single crystal substrate. It goes without saying that the present invention is not limited thereto, and the raw material gas, etc. can be changed appropriately in accordance with a purpose.

First, the silicon single crystal substrate 2 is placed on the susceptor 6 disposed inside the reaction chamber 3.

As the silicon single crystal substrate, a substrate having a diameter of 300 mm or more, for example, can be used. In the conventional method, when the diameter is relatively large, the peripheral sag in the outermost region tends to be generated. Thus, the epitaxial growth method of the present invention is highly effective in preventing the peripheral sag in particular. However, the present invention is not limited to a substrate having a diameter of 300 mm or more; the present invention can be applied to a substrate having a diameter smaller than 300 mm.

Moreover, at this time, it is preferable to use, for example, a susceptor having one or more through holes formed therein as the susceptor 6 on which the silicon single crystal substrate 2 is placed as described above. The reason is as follows. By using the susceptor having one or more through holes formed therein, a native oxide film on the back surface of the silicon single crystal substrate 2 is removed during operation, making it possible to discharge products formed by the decomposition of the native oxide film through the through holes. By forming more than one through hole described above in particular over the entire surface of the susceptor 6, it is possible to remove the native oxide film effectively on the entire back surface of the silicon single crystal substrate 2.

Incidentally, by making the support shaft 9 supporting the susceptor 6 rotate by an unillustrated rotation mechanism during operation, the susceptor 6 and the silicon single crystal substrate 2 placed thereon are rotated.

Next, heating is performed by the heating units 8, such as halogen lamps, which are provided outside the reaction chamber 3. Incidentally, at this time, heating is desirably performed while controlling the temperature of the silicon single crystal substrate 2 by a pyrometer or the like.

Then, hydrogen serving as the carrier gas and trichlorosilane serving as the raw material gas are introduced into the reaction chamber 3 through the gas feed port 4 at a predetermined flow rate in accordance with a purpose such as productivity, whereby a silicon single crystal layer is deposited on the silicon single crystal substrate 2. The unreacted gas or the like is exhausted through the gas exhaust port 5 (Note that the above is a main test).

However, in the present invention, before epitaxial growth is performed, the radius of curvature (R) of the upper wall 7 of the reaction chamber 3 and a difference (H) between the upper end of the gas feed port 4 and the lower end of the upper wall 7 of the reaction chamber 3 in the height direction are adjusted in advance in accordance with the flow rate of hydrogen which is introduced into the reaction chamber 3.

In this way, by performing the epitaxial growth after making an appropriate adjustment to the upper wall 7 of the reaction chamber 3 in accordance with the flow rate of hydrogen serving as the carrier gas, when the silicon single crystal layer is deposited on the silicon single crystal substrate 2 inside the reaction chamber 3 by the pyrolysis reaction of trichlorosilane and the reaction of trichlorosilane with hydrogen, it is possible to deposit the epitaxial layer actively from the outermost region of the silicon single crystal substrate 2, making it possible to prevent the generation of a large peripheral sag as in the conventional method. Moreover, it is possible to deposit the epitaxial layer more uniformly than the conventional method from the outer region toward the center of the silicon single crystal substrate 2. The reason is considered to be as follows. As a result of the height position of the upper wall 7 having been appropriately adjusted, the raw material gas is uniformly fed to the silicon single crystal substrate 2.

That is, it is possible to obtain an excellent epitaxial silicon single crystal substrate with an epitaxial layer having a uniform film thickness distribution on the entire surface thereof.

Furthermore, it is also possible to obtain the effects produced by the set flow rate of carrier gas (with a high flow rate, the quality of the back surface of the single crystal substrate; with a low flow rate, a decrease in frequency of cleaning of the inside of the reaction chamber and a resultant increase in productivity).

Incidentally, the degree of the above adjustment made to the upper wall 7 of the reaction chamber 3 in accordance with the flow rate of carrier gas can be determined by, for example, performing a test in advance prior to the main test described above. This preliminary test will be described in detail.

In the epitaxial growth apparatus, the flow rate of carrier gas is set at a predetermined flow rate in accordance with a purpose in the same manner as in the main test, and a process in which an epitaxial layer is deposited on a silicon single crystal substrate by introducing the raw material gas and the carrier gas into the reaction chamber is repeatedly performed while changing the R and H described above, whereby the epitaxial silicon single crystal substrates having the epitaxial layers deposited under the conditions with respective values of R and H are obtained. The R and H can be changed by, for example, preparing a plurality of patterns of members forming the upper walls 7 which differ in R and H and changing the pattern for another.

Next, the film thickness distributions of the epitaxial layers of the epitaxial silicon single crystal substrates thus obtained are measured. Then, based on the measurement results, proper R and H to deposit an epitaxial layer with an excellent film thickness distribution, for example, with respect to a predetermined flow rate of the carrier gas are selected.

Then, after the R and H are adjusted to the proper R and H selected in the manner as described above, an epitaxial silicon single crystal substrate can be actually produced in the above-described main test.

Incidentally, the set flow rate of the carrier gas in the main test (or the preliminary test) can be set in accordance with a purpose such as productivity and the quality of the back surface of the single crystal substrate.

In other words, the flow rate may be set at a high flow rate in order to maintain the quality of the back surface of the single crystal substrate as described above. Alternatively, the carrier gas may be set at a low flow rate in order to avoid contamination of the growth apparatus with by-products of the raw material gas and increase productivity. By setting the flow rate at a high flow rate, it is possible to prevent the formation of halo and deterioration of nanotopology on the back surface of the single crystal substrate.

Hereinafter, the preliminary test described above will be described more specifically by taking an example.

Here, a description will be given of a case in which a single wafer processing epitaxial growth apparatus (Centura manufactured by Applied Materials, Inc.) provided with a reaction chamber having an upper wall with a radius of curvature (R) of 3556 mm, the single wafer processing epitaxial growth apparatus in which a difference (H) between the upper end of the gas feed port and the lower end of the upper wall of the reaction chamber in the height direction is 1.5 mm, in the standard specifications of the manufacturer is used.

In FIGS. 3 and 4 and FIGS. 5 to 7, an example of the measurement results of the film thickness distributions (on the diameter) of the epitaxial layers obtained by performing the epitaxial growth by purposely changing the above R and H is shown.

Figure 3:
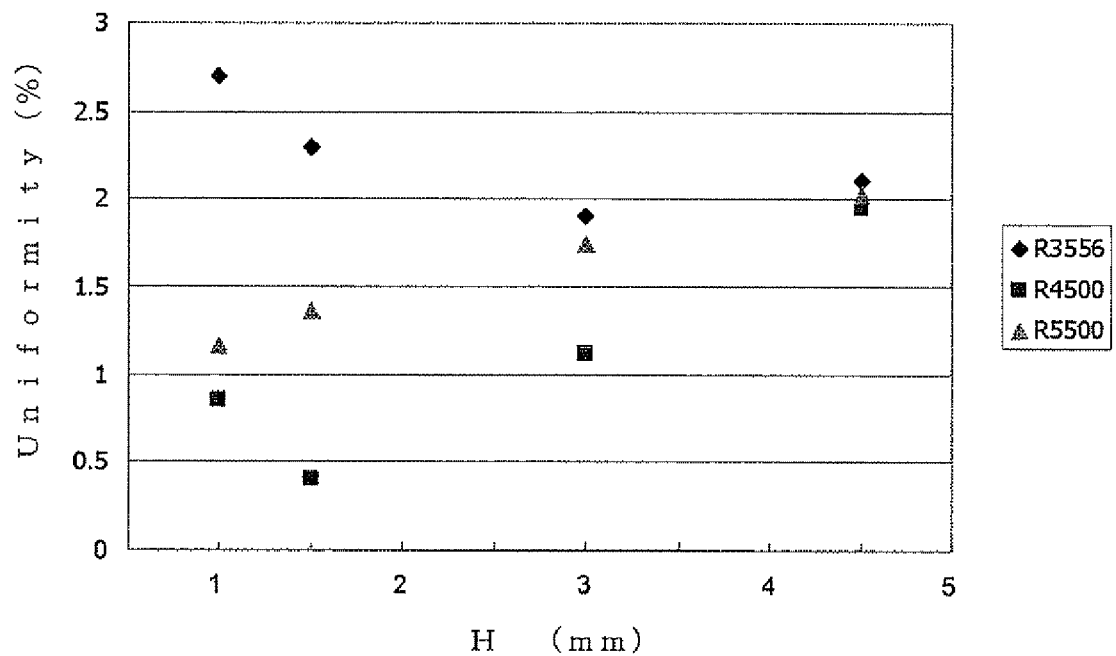
FIG. 3 It is a graph and table showing an example of measurement results of the film thickness distribution (Uniformity) of an epitaxial layer when the carrier gas flow rate is 80 slm.

Here, FIG. 3 shows Uniformity of the epitaxial layer when the flow rate of trichlorosilane serving as the raw material gas is set at 16 slm and the flow rate of hydrogen serving as the carrier gas is set at a high flow rate (here, 80 slm), which is higher than 70 slm. First, FIG. 3 and FIGS. 5 and 6 will be described below.

Incidentally, in measuring the film thickness distribution of the epitaxial layer, the thickness of the epitaxial layer is first measured based on a difference in optical path length between interface reflection and surface reflection by the FT-IR. One epitaxial silicon single crystal substrate is measured under each condition, and there are a total of 33 measurement points in both radial directions (on the diameter) of the single crystal substrate.

Moreover, 5 mm of the outermost region is excluded from the measurement region.

In this way, the thickness of the epitaxial layer at each measurement point is measured, Deviation at each measurement point is obtained based on the measured value, and Uniformity serving as an indicator of whether the film thickness distribution of the epitaxial layer is good or bad is obtained based on the greatest film thickness and the smallest film thickness at each measurement point in one substrate. It means having the more uniform and better film thickness distribution that the value of Uniformity is smaller.

Expressions for obtaining Deviation and Uniformity are as follows.

$$\text{Deviation} = \frac{\text{Measured value} - \text{Ave}}{\text{Ave}} \times 100 \quad \text{[Expression 1]}$$

$$\text{Uniformity} = \frac{\text{Film thickness (Max)} - \text{Film thickness (Min)}}{\text{Film thickness (Max)} + \text{Film thickness (Min)}} \times 100 \quad \text{[Expression 2]}$$

As shown in FIG. 3, in the standard specifications (R=3556 mm and H=1.5 mm), Uniformity is 2.3%. However, by changing the R to 4500 mm or more but less than 7500 mm and setting the H to 0 mm or more but 2 mm or less, it is possible to make Uniformity have a relatively small value (1.37% or less). In particular, when the R is changed to 4500 mm and H is changed to 1 to 1.5 mm, respectively, Uniformity is reduced to a small value, 0.4 to 0.85%, which is less than 1%, and the epitaxial layer having an especially uniform and good film thickness distribution compared to that in the standard specifications is obtained.

Figure 5:
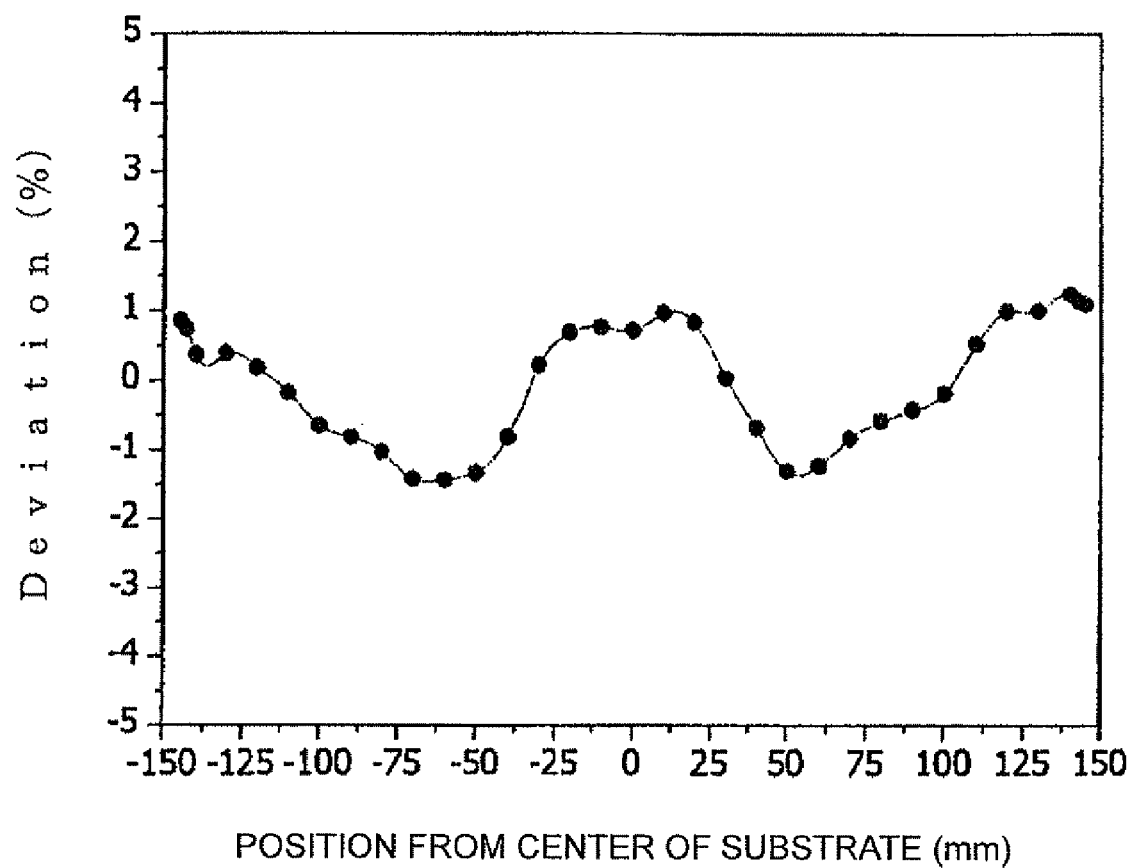
FIG. 5 It is a graph showing an example of Deviation at each measurement point when the carrier gas flow rate is 80 slm in the standard specifications.
Figure 6:
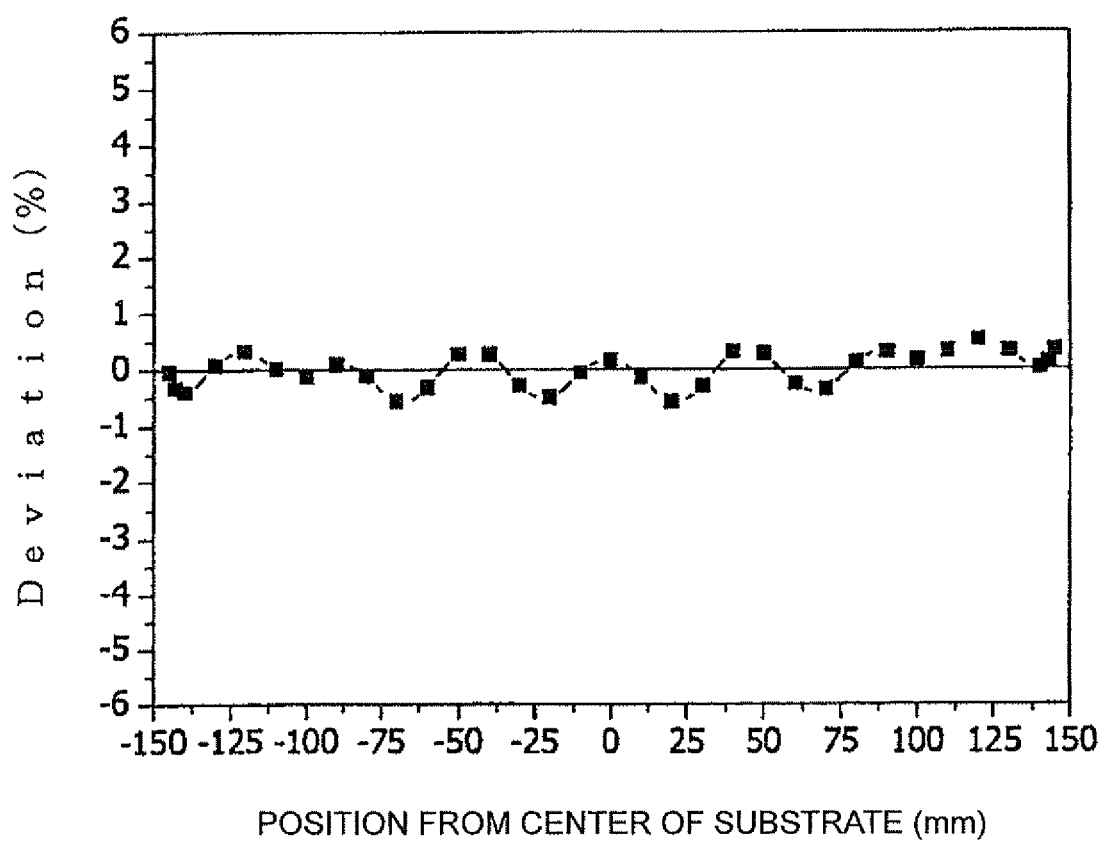
FIG. 6 It is a graph showing an example of Deviation at each measurement point when the carrier gas flow rate is 80 slm, R=4500 mm, and H=1.5 mm.
Figure 7:
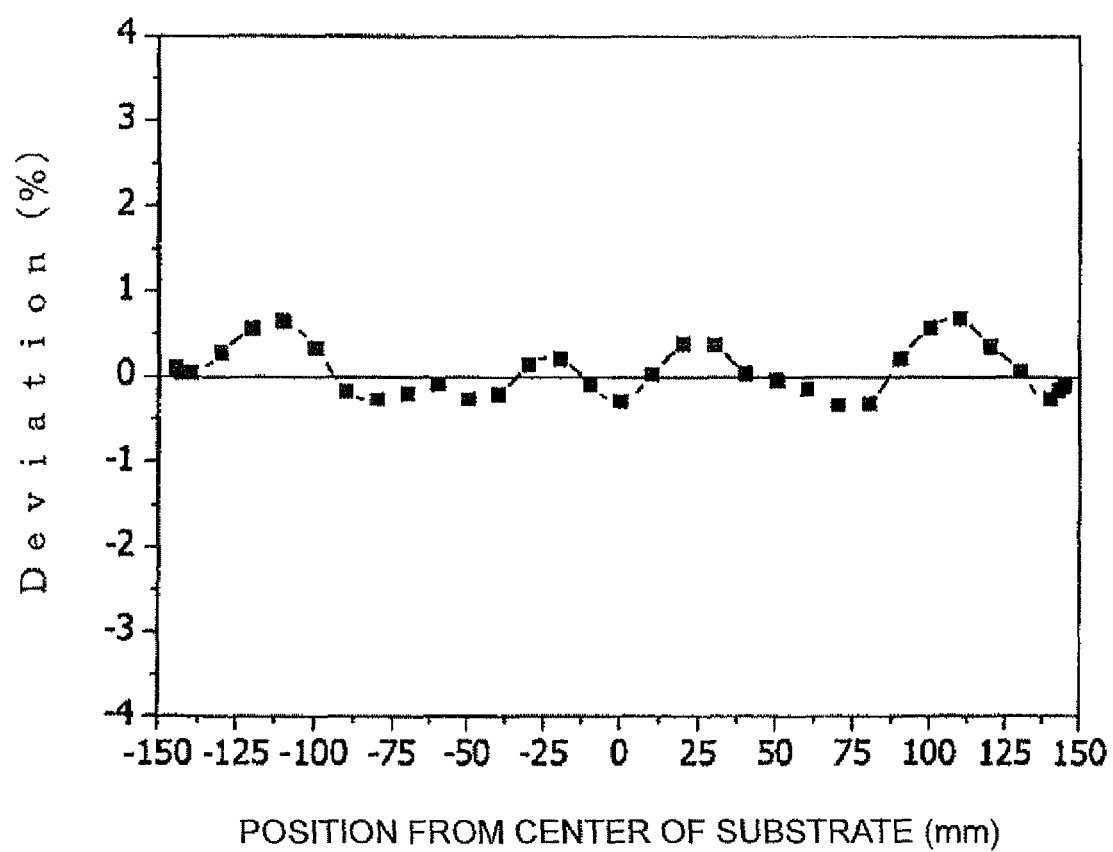
FIG. 7 It is a graph showing an example of Deviation at each measurement point when the carrier gas flow rate is 50 slm, R=3556 mm, and H=4.5 mm.
Figure 8:
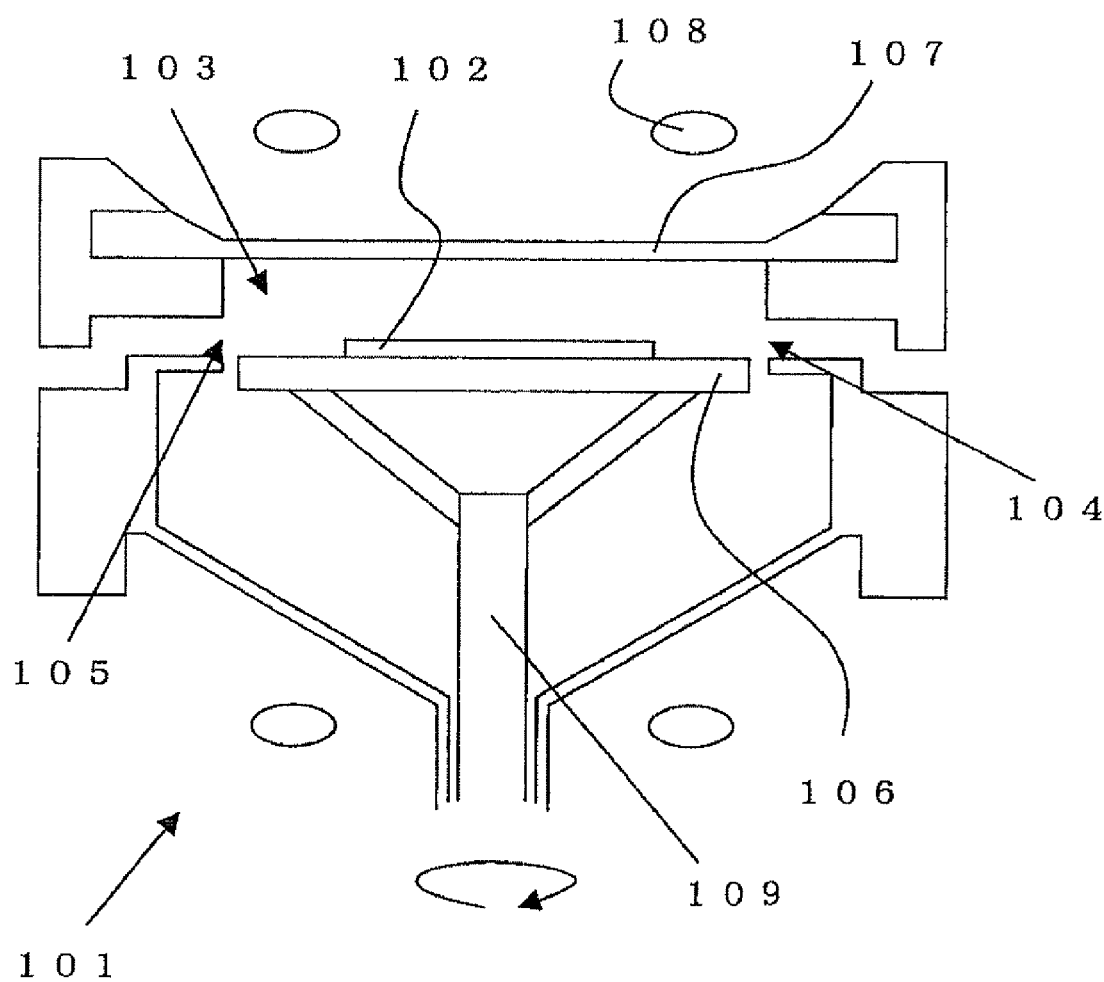
FIG. 8 It is a schematic diagram showing an example of a common single wafer processing epitaxial growth apparatus.

FIGS. 5 to 7 show an example of Deviation at each measurement point. FIG. 5 shows an example in the standard specifications (R=3556 mm and H=1.5 mm), and FIG. 6 shows an example when R=4500 mm and H=1.5 mm. As is clear from FIGS. 5 and 6, by changing the R and H, it is possible to obtain different epitaxial layer's film thickness distributions. This makes it possible to improve the film thickness of the epitaxial layer.

Moreover, as a result of the study of the peripheral sag in the outermost region in the epitaxial silicon single crystal substrate obtained under each condition, the same tendency as in the results of FIGS. 3 and 6 was observed, that is, the most excellent results were obtained when R=4500 mm and H=1.5 mm.

Incidentally, the study of the peripheral sag was conducted by performing measurement by a flatness measuring instrument (WaferSight) manufactured by ADE Phase Shift, Inc. Second order differential is performed on the amount of displacement (unevenness) on the front surface of the epitaxial wafer by this measuring instrument in the direction of the radius of a wafer, whereby it is possible to know in which position in the radius of a wafer an accelerated change in surface displacement is occurring.

Figure 4:
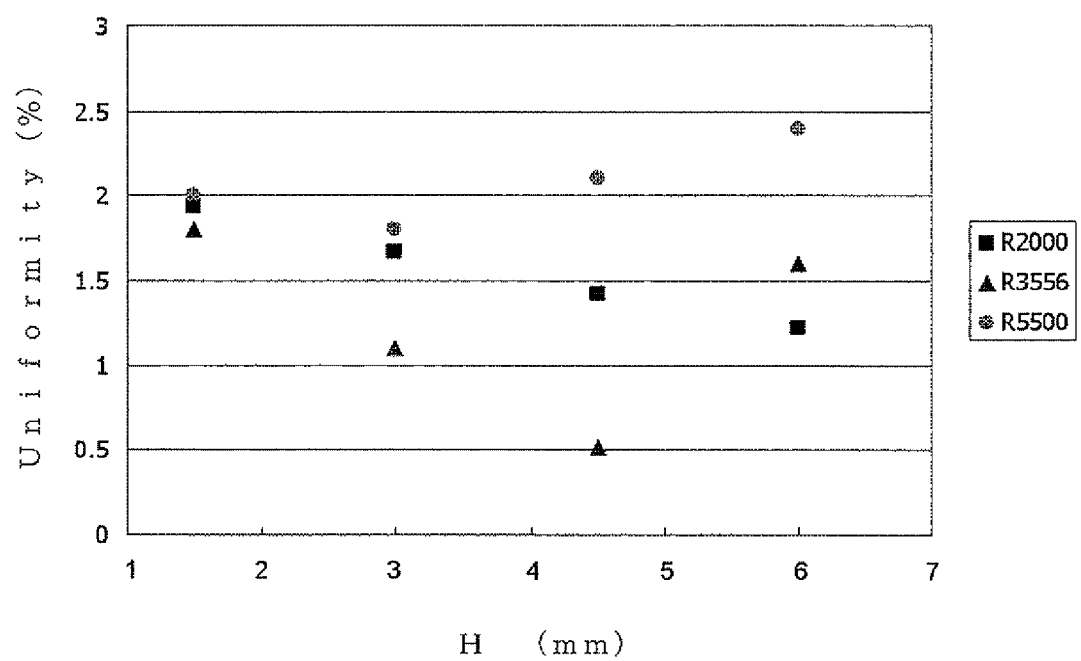
FIG. 4 It is a graph and table showing an example of measurement results of the film thickness distribution (Uniformity) of an epitaxial layer when the carrier gas flow rate is 50 slm.

On the other hand, FIG. 4 shows a case in which the flow rate of trichlorosilane serving as the raw material gas is set at 16 slm and the flow rate of hydrogen serving as the carrier gas is set at a low flow rate (here, 50 slm) which is lower than 60 μm.

As shown in FIG. 4, in the standard specifications (R=3556 mm and H=1.5 mm), Uniformity is 1.8%. However, by adjusting the H to 2.5 mm or more and adjusting the R to more than 3000 mm but less than 4500 mm, for example, it is possible to make Uniformity have a relatively small value (1.6% or less). In particular, when the H is changed to 3 to 4.5 mm while maintaining the R at 3556 mm, it is possible to obtain Uniformity of 0.51 to 1.1%, and obtain an epitaxial layer with an excellent film thickness distribution.

Moreover, FIG. 7 shows Deviation at each measurement point when R=3556 mm and H=4.5 mm. This graph also reveals that an excellent film thickness distribution is obtained.

Furthermore, the study of the peripheral sag in the outermost region revealed that, also in this case, the peripheral sag became minimum when R=3556 mm and H=4.5 mm.

It is preferable to obtain, by the above-described preliminary test or the like, the radius of curvature (R) of the upper wall of the reaction chamber and a difference (H) between the upper end of the gas feed port and the lower end of the upper wall of the reaction chamber in the height direction, the radius of curvature (R) and difference (H) with which the film thickness distribution that fits the purpose can be obtained in accordance with the set flow rate of the carrier gas in the main test.

Then, as described earlier, after the radius of curvature (R) of the upper wall of the reaction chamber and a difference (H) between the upper end of the gas feed port and the lower end of the upper wall of the reaction chamber in the height direction are appropriately adjusted, as the main test, in accordance with a predetermined flow rate of carrier gas to obtain desired productivity and quality of the back surface of the single crystal substrate, epitaxial growth is performed on the silicon single crystal substrate 2. By doing so, unlike the conventional method, the peripheral sag in the outermost region of the single crystal substrate is dramatically suppressed, making it possible to deposit a uniform epitaxial layer on the entire surface. That is, it is possible to obtain an epitaxial silicon single crystal substrate having both productivity, the quality of the back surface of the substrate, and the like, and a good film thickness distribution of the epitaxial layer.

An explanation will be given by using a specific example in the preliminary test described above, for example. The flow rate of hydrogen serving as the carrier gas is set at 70 slm or more (here, 80 slm), which is a relatively high flow rate, and, accordingly, the R is adjusted to 4500 mm or more but less than 7500 mm (here, 4500 mm) and the H is adjusted to 0 mm or more but 2 mm or less (here, 1.5 mm). When epitaxial growth is performed under this condition, an epitaxial silicon single crystal substrate having a back surface of good quality and a uniform epitaxial layer, like Uniformity shown in FIG. 3, is obtained.

Alternatively, the flow rate of hydrogen serving as the carrier gas is set at 60 slm or less (here, 50 slm), which is a relatively low flow rate, and, accordingly, the R is adjusted to more than 3000 mm but less than 4500 mm (here, 3556 mm) and the H is adjusted to 2.5 mm or more (here, 4.5 mm). When epitaxial growth is performed under this condition, it is possible to perform epitaxial growth with increased productivity and low frequency of cleaning of the inside of the reaction chamber, and obtain an epitaxial silicon single crystal substrate having a uniform epitaxial layer, like Uniformity shown in FIG. 4.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The above examples are explained by taking specific numeric values as examples of the flow rate of carrier gas, the radius of curvature (R) of the upper wall of the reaction chamber, and a difference (H) between the upper end of the gas feed port and the lower end of the upper wall of the reaction chamber in the height direction. It goes without saying that the numeric values are not limited to those values, and the present invention can be implemented by appropriately changing those numeric values.

The invention claimed is:

1. An epitaxial growth method which is a single wafer processing epitaxial growth method by which at least a single crystal substrate is placed in a reaction chamber with an upper wall having a downward convexity and an epitaxial layer is deposited on the single crystal substrate by introducing raw material gas and carrier gas into the reaction chamber through a gas feed port, wherein
after any one of a radius of curvature of the upper wall of the reaction chamber and a difference between an upper end of the gas feed port and a lower end of the upper wall of the reaction chamber in a height direction or both are adjusted in accordance with a flow rate of the carrier gas which is introduced into the reaction chamber through the gas feed port, an epitaxial layer is deposited on the single crystal substrate.

2. The epitaxial growth method according to claim 1, wherein
when the epitaxial layer is deposited on the single crystal substrate, the single crystal substrate is placed on a susceptor having one or more through holes formed therein.

3. The epitaxial growth method according to claim 1, wherein
the single crystal substrate has a diameter of 300 mm or more.

4. The epitaxial growth method according to claim 2, wherein the single crystal substrate has a diameter of 300 mm or more.

5. The epitaxial growth method according to claim 1, wherein
as the raw material gas, trichlorosilane is used, and, as the carrier gas, hydrogen is used.

6. The epitaxial growth method according to claim 2, wherein
as the raw material gas, trichlorosilane is used, and, as the carrier gas, hydrogen is used.

7. The epitaxial growth method according to claim 3, wherein
as the raw material gas, trichlorosilane is used, and, as the carrier gas, hydrogen is used.

8. The epitaxial growth method according to claim 4, wherein
as the raw material gas, trichlorosilane is used, and, as the carrier gas, hydrogen is used.

9. The epitaxial growth method according to claim 1, wherein
when the flow rate of the carrier gas which is introduced into the reaction chamber through the gas feed port is set at more than 70 slm, any one of adjustments or both are made such that the radius of curvature of the upper wall of the reaction chamber becomes 4500 mm or more but less than 7500 mm and a difference between the upper end of the gas feed port and the lower end of the upper wall of the reaction chamber in the height direction becomes 0 mm or more but 2 mm or less.

10. The epitaxial growth method according to claim 2, wherein
when the flow rate of the carrier gas which is introduced into the reaction chamber through the gas feed port is set at more than 70 slm, any one of adjustments or both are made such that the radius of curvature of the upper wall of the reaction chamber becomes 4500 mm or more but less than 7500 mm and a difference between the upper end of the gas feed port and the lower end of the upper wall of the reaction chamber in the height direction becomes 0 mm or more but 2 mm or less.

11. The epitaxial growth method according to claim 3, wherein
when the flow rate of the carrier gas which is introduced into the reaction chamber through the gas feed port is set at more than 70 slm, any one of adjustments or both are made such that the radius of curvature of the upper wall of the reaction chamber becomes 4500 mm or more but less than 7500 mm and a difference between the upper end of the gas feed port and the lower end of the upper wall of the reaction chamber in the height direction becomes 0 mm or more but 2 mm or less.

12. The epitaxial growth method according to claim 4, wherein
when the flow rate of the carrier gas which is introduced into the reaction chamber through the gas feed port is set at more than 70 slm, any one of adjustments or both are made such that the radius of curvature of the upper wall of the reaction chamber becomes 4500 mm or more but less than 7500 mm and a difference between the upper end of the gas feed port and the lower end of the upper wall of the reaction chamber in the height direction becomes 0 mm or more but 2 mm or less.

13. The epitaxial growth method according to claim 5, wherein
when the flow rate of the carrier gas which is introduced into the reaction chamber through the gas feed port is set at more than 70 slm, any one of adjustments or both are made such that the radius of curvature of the upper wall of the reaction chamber becomes 4500 mm or more but less than 7500 mm and a difference between the upper end of the gas feed port and the lower end of the upper wall of the reaction chamber in the height direction becomes 0 mm or more but 2 mm or less.

14. The epitaxial growth method according to claim 6, wherein
when the flow rate of the carrier gas which is introduced into the reaction chamber through the gas feed port is set at more than 70 slm, any one of adjustments or both are made such that the radius of curvature of the upper wall of the reaction chamber becomes 4500 mm or more but less than 7500 mm and a difference between the upper end of the gas feed port and the lower end of the upper wall of the reaction chamber in the height direction becomes 0 mm or more but 2 mm or less.

15. The epitaxial growth method according to claim 7, wherein when the flow rate of the carrier gas which is introduced into the reaction chamber through the gas feed port is set at more than 70 slm, any one of adjustments or both are made such that the radius of curvature of the upper wall of the reaction chamber becomes 4500 mm or more but less than 7500 mm and a difference between the upper end of the gas feed port and the lower end of the upper wall of the reaction chamber in the height direction becomes 0 mm or more but 2 mm or less.

16. The epitaxial growth method according to claim 8, wherein
when the flow rate of the carrier gas which is introduced into the reaction chamber through the gas feed port is set at more than 70 slm, any one of adjustments or both are made such that the radius of curvature of the upper wall of the reaction chamber becomes 4500 mm or more but less than 7500 mm and a difference between the upper end of the gas feed port and the lower end of the upper wall of the reaction chamber in the height direction becomes 0 mm or more but 2 mm or less.

17. The epitaxial growth method according to claim 1, wherein
when the flow rate of the carrier gas which is introduced into the reaction chamber through the gas feed port is set at less than 60 slm, any one of adjustments or both are made such that the radius of curvature of the upper wall of the reaction chamber becomes more than 3000 mm but less than 4500 mm and a difference between the upper end of the gas feed port and the lower end of the upper wall of the reaction chamber in the height direction becomes 2.5 mm or more.

18. The epitaxial growth method according to claim 2, wherein
when the flow rate of the carrier gas which is introduced into the reaction chamber through the gas feed port is set at less than 60 slm, any one of adjustments or both are made such that the radius of curvature of the upper wall of the reaction chamber becomes more than 3000 mm but less than 4500 mm and a difference between the upper end of the gas feed port and the lower end of the upper wall of the reaction chamber in the height direction becomes 2.5 mm or more.

19. The epitaxial growth method according to claim 3, wherein
when the flow rate of the carrier gas which is introduced into the reaction chamber through the gas feed port is set at less than 60 slm, any one of adjustments or both are made such that the radius of curvature of the upper wall of the reaction chamber becomes more than 3000 mm but less than 4500 mm and a difference between the upper end of the gas feed port and the lower end of the upper wall of the reaction chamber in the height direction becomes 2.5 mm or more.

20. The epitaxial growth method according to claim 4, wherein
when the flow rate of the carrier gas which is introduced into the reaction chamber through the gas feed port is set at less than 60 slm, any one of adjustments or both are made such that the radius of curvature of the upper wall of the reaction chamber becomes more than 3000 mm but less than 4500 mm and a difference between the upper end of the gas feed port and the lower end of the upper wall of the reaction chamber in the height direction becomes 2.5 mm or more.

21. The epitaxial growth method according to claim 5, wherein when the flow rate of the carrier gas which is introduced into the reaction chamber through the gas feed port is set at less than 60 slm, any one of adjustments or both are made such that the radius of curvature of the upper wall of the reaction chamber becomes more than 3000 mm but less than 4500 mm and a difference between the upper end of the gas feed port and the lower end of the upper wall of the reaction chamber in the height direction becomes 2.5 mm or more.

22. The epitaxial growth method according to claim 6, wherein
when the flow rate of the carrier gas which is introduced into the reaction chamber through the gas feed port is set at less than 60 slm, any one of adjustments or both are made such that the radius of curvature of the upper wall of the reaction chamber becomes more than 3000 mm but less than 4500 mm and a difference between the upper end of the gas feed port and the lower end of the upper wall of the reaction chamber in the height direction becomes 2.5 mm or more.

23. The epitaxial growth method according to claim 7, wherein
when the flow rate of the carrier gas which is introduced into the reaction chamber through the gas feed port is set at less than 60 slm, any one of adjustments or both are made such that the radius of curvature of the upper wall of the reaction chamber becomes more than 3000 mm but less than 4500 mm and a difference between the upper end of the gas feed port and the lower end of the upper wall of the reaction chamber in the height direction becomes 2.5 mm or more.

24. The epitaxial growth method according to claim 8, wherein
when the flow rate of the carrier gas which is introduced into the reaction chamber through the gas feed port is set at less than 60 slm, any one of adjustments or both are made such that the radius of curvature of the upper wall of the reaction chamber becomes more than 3000 mm but less than 4500 mm and a difference between the upper end of the gas feed port and the lower end of the upper wall of the reaction chamber in the height direction becomes 2.5 mm or more.

\* \* \* \* \*